United States Patent [19]

Varadarajan

[11] Patent Number: 4,617,478

[45] Date of Patent: Oct. 14, 1986

[54] EMITTER COUPLED LOGIC HAVING ENHANCED SPEED CHARACTERISTIC FOR TURN-ON AND TURN-OFF

[76] Inventor: Hemmige D. Varadarajan, 1768 Lark La., Sunnyvale, Calif. 94087

[21] Appl. No.: 530,176

[22] Filed: Sep. 7, 1983

[51] Int. Cl.[4] .................. H03K 19/013; H03K 19/086; H03K 19/082; H03K 19/092

[52] U.S. Cl. ..................... 307/455; 307/255; 307/443; 307/355; 307/362

[58] Field of Search ............... 307/443, 445, 467, 457, 307/299 A, 475, 200 A, 272 R, 272 A, 289, 273, 494, 605, 608, 355, 362, 255, 460, 464, 363, 364, 242, 243, 254, 299 R, 317 R, 317 A, 318, 319, 280, 300, 542, 551; 330/252, 261

[56] References Cited

U.S. PATENT DOCUMENTS

| | | | |
|---|---|---|---|
| 3,114,844 | 12/1963 | Leeds | 307/255 |
| 3,281,532 | 10/1966 | Leeds | 307/255 X |
| 3,411,019 | 11/1968 | Jorgensen | 307/255 X |
| 3,582,795 | 6/1971 | Heick | 307/269 X |
| 3,955,099 | 5/1976 | Gaskill, Jr. et al. | 307/455 |
| 4,140,926 | 2/1979 | Price | 307/355 X |
| 4,357,547 | 11/1982 | Espe et al. | 307/272 A |
| 4,401,901 | 8/1983 | Ochi | 307/362 |
| 4,516,039 | 5/1985 | Matsuzaki et al. | 307/443 X |
| 4,538,075 | 8/1985 | Varadarajan | 307/455 X |

*Primary Examiner*—Stanley D. Miller
*Assistant Examiner*—David R. Bertelson

[57] ABSTRACT

In accordance with the invention, the reference portion of a primitive current switch used in emitter coupled logic or current mode logic is modified by introducing a slow device as the reference element in order to enhance the speed of turn on and turn off of the input elements. In particular, the reference transistor of a conventional ECL inverter gate or conventional CML inverter gate is replaced with a slow transistor or slow diode in order to bypass the emitter dynamic resistance. The emitter time constant of the reference element $Q_R$ is thereby increased so that the voltage on the common current source node (node 3) does not change substantially when the base of the input elements change transiently. As a consequence, the collector output of the input element, such as transistor $Q_A$ is switched on or off significantly faster.

4 Claims, 6 Drawing Figures

EMITTER COUPLED LOGIC HAVING ENHANCED SPEED CHARACTERISTIC FOR TURN-ON AND TURN-OFF

BACKGROUND OF THE INVENTION

1. Field of the Invention

This invention relates to emitter coupled logic (ECL) and in particular relates to an emitter coupled logic gate having enhanced speed characteristics.

Emitter coupled logic gates are among the fastest types of digital circuit gates. However, ECL gates have not been able to capitalize on the full speed potential of ECL in inverter gates. Moreover, ECL gates do not handle capacitive loads particularly well. What is needed is a new type of logic circuit which takes better advantage of the potential speed of bipolar technology.

2. Description of the Prior Art

Referring to FIG. 1, there is shown a conventional ECL primitive inverter gate 10 with emitter follower output. The primitive gate 10 comprises a first input transistor $Q_A$, a second input transistor $Q_B$ a reference transistor $Q_R$, a current source transistor $Q_{CS}$, a first load transistor $Q_{L1}$, and a second load transistor $Q_{L2}$. The inverter gate 10 operates between an input A and an input B to produce at an output at node 1 between the emitter of transistor $Q_{L1}$ and the collector of transistor $Q_{L2}$ an output A+B. The emitters of transistors $Q_A$, $Q_B$ and $Q_R$ are coupled at a common node 3 to the collector of current source transistor $Q_{CS}$. A current source bias voltage $V_{CS}$ is maintained at the base of transistors $Q_{CS}$ and $Q_{L2}$. The load of transistor $Q_{CS}$ is through the emitter at a resistor $R_{CS}$ to the lowest reference voltage, herein a ground voltage. The load of transistor $Q_{L2}$ is through a resistor $R_L$ in the emitter-to-ground circuit thereof. The collectors of transistors $Q_A$ and $Q_B$ are coupled in common to a node 2 and to the base of transistor $Q_{L1}$. A collector load resistor $R_{CL}$ is coupled between the source voltage reference $V_{CC}$ and node 2. The collector of transistor $Q_{L1}$ is connected to the $V_{CC}$ voltage. The collector of transistor $Q_R$ is connected to the $V_{CC}$ voltage. Finally, a reference voltage $V_{BB}$ is provided to the base of transistor $Q_R$. Transistors $Q_{L1}$ and $Q_{L2}$ form the emitter follower circuit for the voltage on node 2.

Referring to FIG. 2, there is shown a conventional current mode logic (CML) primitive inverter gate 12. Current mode logic is similar to emitter coupled logic except that there is no emitter follower circuitry. One paper describing CML logic is "A 1500 Gate, Random Logic Large Scale Integrated (LSI) Masterslice", R. J. Blumberg and S. Brenner, *IEEE Journal of Solid State Circuits*, Volume SC-14 No. 5, page 818 (October 1979). In both of the circuits of FIGS. 1 and 2, there is an emitter dynamic resistance and a diffusion capacitance associated with the reference transistor $Q_R$. The emitter dynamic resistance of $Q_R$ and the diffusion capacitance of $Q_R$ are in parallel and define an impedance effectively in series with the emitter of the input transistors $Q_A$ and $Q_B$.

SUMMARY OF THE INVENTION

In accordance with the invention, the reference portion of a primitive current switch used in emitter coupled logic or current mode logic is modified by introducing means for filtering high frequency voltage changes, or transients, thereby slowing voltage change, at the common emitter node as the reference element in order to enhance the speed of turn on and turn off of the input elements. In particular, the reference transistor of a conventional ECL inverter gate or conventional CML inverter gate is replaced with a slow transistor, slow diode or a large capacitor in order to bypass the emitter dynamic resistance. The emitter time constant of the reference element $Q_R$ is thereby increased so that the voltage on the common current source node (node 3) does not change substantially when the base of the input elements change transiently. As a consequence, the collector output of the input element, such as transistor $Q_A$, which is on or off switches significantly faster.

In a specific embodiment, the reference element $Q_R$ is constructed as a conventional transistor with the collector and emitter terminals reversed in a so-called inverted transistor configuration. The inverted transistor configuration has been found to be significantly slower in operation than in the conventional figuration. Alternatively, however, a slow diode, such as a PN type diode, may be placed between the reference voltage $V_{BB}$ and node 3.

The invention will be better understood by reference to the following detailed description taken in conjunction with the accompanying drawings.

DESCRIPTION OF SPECIFIC EMBODIMENTS

Figure 1:
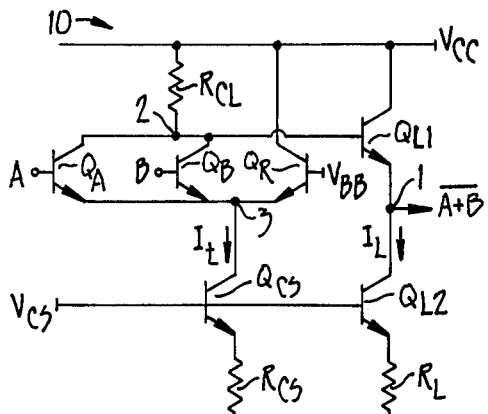
FIG. 1 is a schematic diagram of a prior art ECL primitive inverter gate.
Figure 2:
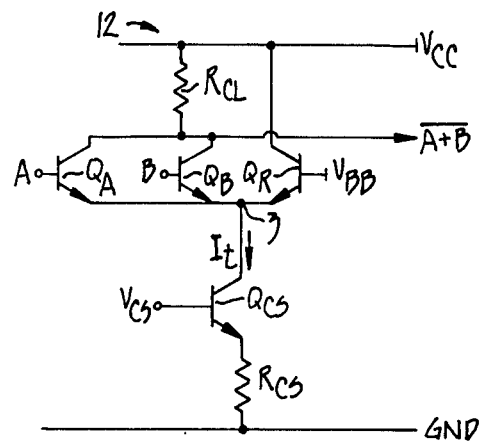
FIG. 2 is a schematic diagram of a prior art primitive CML inverter gate.
Figure 3:
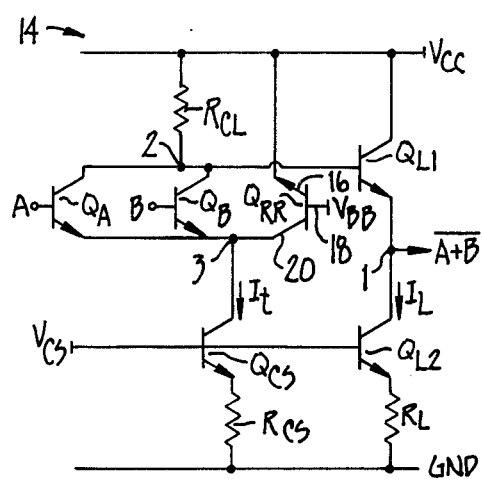
FIG. 3 is a schematic diagram of a first embodiment of a emitter collector coupled primitive inverter gate according to the invention.

FIGS. 1 and 2 have been described previously as prior art structures. Referring to FIG. 3, there is shown an emitter collector coupled logic primitive inverter gate 14 in accordance with the invention. For the sake of consistency, the labels of corresponding elements of each embodiment are the same. Reference is made to FIG. 1 for comparison with FIG. 3. In accordance with the invention, a reference transistor $Q_{RR}$ is provided at node 3. The reference transistor $Q_{RR}$ comprises a first electrode 16, a second electrode 18 and a third electrode 20. The first electrode 16 is comparable to the emitter electrode of a conventional fast transistor. The second electrode 18 is comparable to the base electrode of a conventional transistor, and the third electrode 20 corresponds to the collector electrode of a conventional transistor. However, in this configuration, the first electrode 16 and the third electrode 20 are inverted, that is, the first electrode 16 is coupled as a collector and the third electrode 20 is coupled as an emitter between the voltage source $V_{CC}$ and the node 3. The second electrode 18 is coupled to a bias voltage $V_{BB}$.

The use of a structure such as the reference transistor $Q_{RR}$ of FIG. 3 effectively increases the time constant of the RC combination of the dynamic resistance and the diffusion capacitance of the reference transistor $Q_{RR}$. The increase in the time constant provides filtering of high frequency voltage changes, or transients, and thereby a larger delay at the collector of the reference transistor $Q_{RR}$ on node 3. With the emitter time constant of $Q_{RR}$ (now inverted) increased at node 3, the voltage at node 3 will not change substantially when the voltage to the base of the input transistor $Q_A$ is moved high or low transiently. As a consequence, the transistor $Q_A$ can be turned on or off much faster, and the transistor $Q_A$ will have a correspondingly faster collector output.

Figure 4:
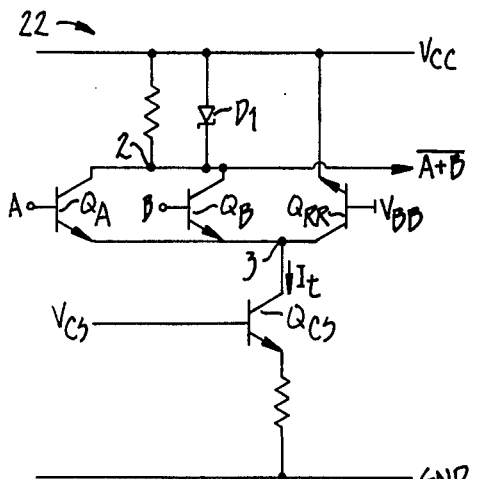
FIG. 4 is a schematic diagram of a modified current mode logic (NCML) primitive inverter gate according to the invention.

Referring to FIG. 4, there is shown an NCML primitive gate 22 in accordance with the invention having a reference transistor $Q_{RR}$ similar to that of the embodiment of FIG. 3. In other words, the reference transistor $Q_{RR}$ is also a slow transistor, generally on the order of one order of magnitude or more slower than the input transistors $Q_A$ and QB. In addition, a diode $D_1$ is provided between the collector voltage source and node 2 to which the collectors of input transistors $Q_A$ and $Q_B$ are coupled. Diode $D_1$ is provided for limiting the possible saturation of the input transistors $Q_A$ or $Q_B$ in current mode logic operation. Separation would normally be caused by the transient current flowing in the reference transistor $Q_A$ during transition in the input signal from low to high voltage (presuming NPN transistor convention). While saturation is only temporary, the use of a saturation controlling diode minimizes the likelihood that saturation might even occur.

Tests of an emitter collector coupled logic gate 14 in accordance with the invention have shown the limiting delay of an ECCL gate to be on the order of 40% less than for a conventional ECL gate at the same power level. It is believed that the gain in speed is a result of greater available current for switching due to the longer time constant in the reference transistor. Moreover, it has been found that NCML logic gates in accordance with the invention switch even faster. NCML gates according to the invention also have superior capacitive load handling capability in comparison with conventional current mode logic. It is believed this is because the elements of an NCML gate have greater capacity for current drain so that external loads can be discharged faster.

Figure 5:
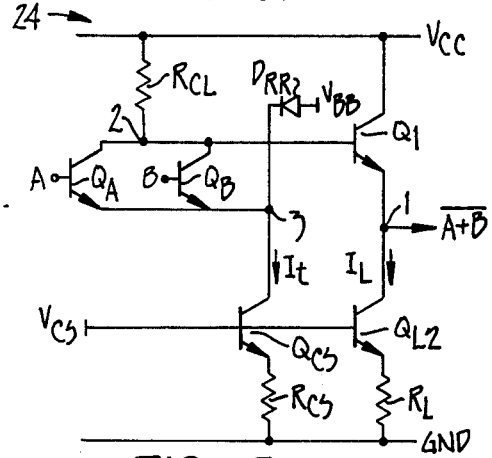
FIG. 5 is a schematic diagram of a second embodiment of an ECCL gate according to the invention.
Figure 6:
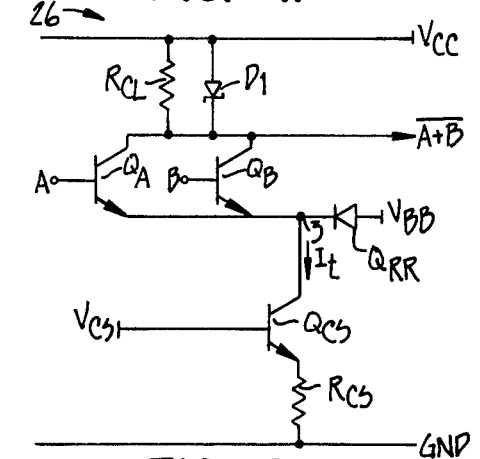
FIG. 6 is a second embodiment of an NCML primitive gate according to the invention.

FIGS. 5 and 6 illustrate alternative embodiments of an ECCL gate and NCML gate 26 which use a reference diode $Q_{RR}$. There is the trade-off between the use of a reference diode and a slow reference transistor in accordance with the invention. A slow reference transistor has the advantage of less required space in integrated circuit design. The reference supply must have a good current capacity if the gain of the transistor is low. Alternatively a slow diode may be used instead of slow transistors as shown in FIGS. 5 and 6.

The invention thus described may be used in all inverting logic circuitry and can be mixed with conventional non-inverting logic circuits where necessary. A faster inverting output is therefore available for design of high-speed circuitry.

The invention has been explained with reference to specific embodiments. Other embodiments will be apparent to those of ordinary skill in the art. For example, a capacitor could be substituted for the reference elements to store charge and thus increase the time constant as desired. It is therefore not intended that this invention be limited except as indicated by the appended claims.

What is claimed is:

1. A device for switching current, comprising:
   a common node connected to receive the current;
   an output node connectable to provide an output;
   a least one input transistor having a collector connected to said output node, an emitter connected to said common node, and a base connected to receive at least one input signal; and
   reference means connected to said common node for supplying a switching bias at said common node, including means for filtering high frequency voltage change at said common node, wherein said filtering means includes a transistor having a base connected to a bias voltage, an emitter connected to a supply voltage and a collector connected to said common node.

2. A digital logic gate for switching current, comprising:
   a common node connected to receive the current;
   an output node connectable to provide an output;
   at least one input transistor having a collector connected to said output node, an emitter connected to said common node, and a base connected to receive at least one input signal; and
   reference means connected to said common node for supplying a switching reference at said common node, including a reference transistor having a base connected to a bias voltage, an emitter coupled to a supply voltage, and a collector coupled to said common node; wherein
   said at least one input transistor is one of an NPN bipolar type transistor or a PNP bipolar type transistor, and said reference transistor is said one type.

3. The device of claim 1 or 2, further including an emitter follower output circuit coupled to said output node to form an emitter coupled logic gate.

4. The digital logic gate of claim 2, wherein:
   said at least one input transistor has a base-to-emitter junction, an RC combination of a dynamic resistance and a diffusion capacitance of the base-to-emitter junction of the at least one input transistor and an input time constant representing the RC combination; and
   said reference transistor has a collector-to-emitter junction, an RC combination of a dynamic resistance and a diffusion capacitance of the collector-to-base junction of the reference transistor, and a time constant representing the RC combination that is at least an order to magnitude greater than the input time constant of the at least one input transistor.

* * * * *

UNITED STATES PATENT AND TRADEMARK OFFICE
CERTIFICATE OF CORRECTION

PATENT NO. : 4,617,478

DATED : Oct. 14, 1986

INVENTOR(S) : Hemmige D. Varadarajan

It is certified that error appears in the above-identified patent and that said Letters Patent is hereby corrected as shown below:

On the Title Page add:

Assignee: Advanced Micro Devices, Inc.
Sunnyvale, Calif.

Attorney, Agent, or Firm - Patrick T. King;
J. Vincent Tortolano;
Mark A. Haynes Signed and Sealed this Seventh Day of April, 1987

Attest:

DONALD J. QUIGG

Attesting Officer

Commissioner of Patents and Trademarks